US012618888B2

(12) United States Patent
Williams et al.

(10) Patent No.: US 12,618,888 B2
(45) Date of Patent: May 5, 2026

(54) ELECTRICAL GRID EDGE EVENT DETECTION AND MITIGATION

(71) Applicant: Oracle International Corporation, Redwood Shores, CA (US)

(72) Inventors: Bradley Roy Williams, Brush Prairie, WA (US); Cornell Thomas Eyford, III, Ridgefield, WA (US); Apirux Bantukul, Cary, NC (US); Ruixian Liu, San Diego, CA (US); Kenny Gross, Escondido, CA (US)

(73) Assignee: Oracle International Corporation, Redwood Shores, CA (US)

( * ) Notice: Subject to any disclaimer, the term of this patent is extended or adjusted under 35 U.S.C. 154(b) by 328 days.

(21) Appl. No.: 18/355,544

(22) Filed: Jul. 20, 2023

(65) Prior Publication Data

US 2025/0027981 A1 Jan. 23, 2025

(51) Int. Cl.
*G01R 31/08* (2020.01)
*G01P 15/093* (2006.01)

(52) U.S. Cl.
CPC .......... *G01R 31/086* (2013.01); *G01P 15/093* (2013.01)

(58) Field of Classification Search
CPC . G01R 31/086; G01R 19/2513; G01P 15/093; G06N 20/00; H02J 3/0012; H02J 13/00002
See application file for complete search history.

(56) References Cited

U.S. PATENT DOCUMENTS

| | | | |
|---|---|---|---|
| 10,215,621 B2 | 2/2019 | Oshetski et al. | |
| 10,937,114 B2 | 3/2021 | Franklin, Jr. et al. | |
| 11,010,694 B2 | 5/2021 | Gross et al. | |
| 2016/0239010 A1 * | 8/2016 | McDaniel | H02J 13/00002 |
| 2020/0212676 A1 * | 7/2020 | Dehghanian | G01R 19/2513 |

FOREIGN PATENT DOCUMENTS

| | | | | |
|---|---|---|---|---|
| CN | 110398675 A | * 11/2019 | | G01R 31/14 |

OTHER PUBLICATIONS

Hamid et al. "Machine Learning-Based Fault Location for Smart Distribution Networks Equipped with Micro-PMU", Journal Sensors, 2022, 22, 945 (Year: 2022).*

(Continued)

*Primary Examiner* — Eman A Alkafawi
*Assistant Examiner* — Dilara Sultana
(74) *Attorney, Agent, or Firm* — Potomac Law Group, PLLC

(57) ABSTRACT

Embodiments detect one or more events on an electrical grid. Embodiments use a sensor installed at an edge of the electrical grid to generate a sensor waveform at a first sampling rate corresponding to current and/or voltage signals. Embodiments transform the sensor waveform into multiple frequency bands and digitize the multiple frequency bands at a second sampling rate that is lower than the first sampling rate. Embodiments receive, by a pattern recognition machine learning algorithm at the edge, the digitized multiple frequency bands for events and predict, using the ML algorithm, an occurrence of the one or more events.

20 Claims, 10 Drawing Sheets

(56)     References Cited

OTHER PUBLICATIONS

Beniwal et al. "A Critical Analysis of Methodologies for Detection and Classification of Power Quality Events in Smart Grid," in IEEE Access, vol. 9, pp. 83507-83534, 2021, Critical Analysis of Methodologies for Detection and Classification of Power Quality Events in Smart Grid (Year: 2021).*

Wang et al. "Distributed Intelligence for Online Situational Awareness in Power Grids", IEEE Transactions on Power Systems, vol. 37, No. 4, Jul. 2022. (Year: 2022).*

A. Joglekar et al., "Open-Source Heterogeneous Constrained Edge-Computing Platform for Smart Grid Measurements," in IEEE Transactions on Instrumentation and Measurement, vol. 70, pp. 1-12, 2021, (Year: 2021).*

International Search Report and Written Opinion for International Application No. PCT/US2024/035533 dated Sep. 25, 2024.

Rivas et al., "Faults in smart grid systems: Monitoring, detection and classification", Electric Power Systems Research, Elsevier, Amsterda,. NL, Nol. 189, Aug. 4, 2020.

* cited by examiner

ELECTRICAL GRID EDGE EVENT DETECTION AND MITIGATION

FIELD

One embodiment is directed generally to an electrical grid, and in particular to the detection and mitigation of events on the electrical grid.

BACKGROUND INFORMATION

An electrical grid is an interconnected network for electricity delivery from producers to consumers. Electrical grids vary in size and can cover whole countries or continents. An electrical grid includes: (1) power stations that are often located near energy and away from heavily populated areas; (2) electrical substations to step voltage up or down; (3) electric power transmission to carry power long distances; and (4) electric power distribution to individual customers, where voltage is stepped down again to the required service voltage.

One challenge for utilities that manage and operate distributed electrical grids is the fairly common scenario where overhead conductors come into contact with a falling branch, creating a high impedance fault. In response, protection systems need to de-energize the respective conductors, but this can take a long time (e.g., minutes). The falling branch on conductors can cause electrocutions and can start wildfires and cause huge potential liability to the electric utility.

In generally, for the utility to de-energize the falling conductors when utility protection equipment does not sense the faults, a human will make an emergency call to police/fire dispatchers, and the dispatchers will contact the utility emergency response center with the reported location of the fallen tree branch in the line and/or the actual fallen conductor. However, it can take 30 minutes or longer before a utility crew can respond and de-energize the impacted conductor, or longer if, for example, a tree branch falls into a line and/or takes down a line in the middle of the night with no witnesses.

A similar challenge for utilities is to support grid stability in view of the rapid growth of inverter based distributed energy resources (e.g., rooftop solar photovoltaic ("PV") panels, battery energy storage, most wind turbine DC-AC connections, and EV charging systems) and the decommissioning of large central power plants with their synchronous generators that have traditionally held grids together through disturbances with their spinning inertia of the generator turbine. To support decarbonization and grid resiliency, new approaches are needed to provide what is referred to as "synthetic inertia" through autonomous real-time operations at the edge devices.

Another challenge for utilities in supporting grid edge processing is manageability of equipment deployed at the grid edge. Due to the distributed nature, there will be numerous distributed equipment spread across wide geographical areas. The status, such as configuration, software version, computing resource utilization, etc., must be managed to ensure the proper functionalities and compatibility across the power grid. Manual management of the equipment, such as sending service personnel to each site to update equipment's software, is too slow due to the geographically distributed nature of these equipment as well as highly error prone. Remote management of the equipment, such as managing software versioning, managing configurations, etc., is needed to ensure effective power grid performance.

SUMMARY

Embodiments detect one or more events on an electrical grid. Embodiments use a sensor installed at an edge of the electrical grid to generate a sensor waveform at a first sampling rate corresponding to current and/or voltage signals. Embodiments transform the sensor waveform into multiple frequency bands and digitize the multiple frequency bands at a second sampling rate that is lower than the first sampling rate. Embodiments receive, by a pattern recognition machine learning algorithm at the edge, the digitized multiple frequency bands for events and predict, using the ML algorithm, an occurrence of the one or more events.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Embodiments incorporate a fast-throughput, low-latency pattern recognition algorithm integrated with an advanced optical current/voltage sensor that attaches to legacy distribution assets. The sensor with integrated super-fast prognostic machine learning ("ML") performs continuous streaming prognostics of conductor integrity and is able to detect the leading edge of incipient degradation. Embodiments can, in real-time or near real-time, actuate a signal to the nearest upstream feeder substation to de-energize the conductor before it hits the ground. Further, when connected devices sense frequency and voltage violations outside of operating standards, embodiments can autonomously respond with appropriate mitigation within the smart inverter's control capabilities.

Reference will now be made in detail to the embodiments of the present disclosure, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, components, and circuits have not been described in detail so as not to unnecessarily obscure aspects of the embodiments. Wherever possible, like reference numbers will be used for like elements.

Figure 1:
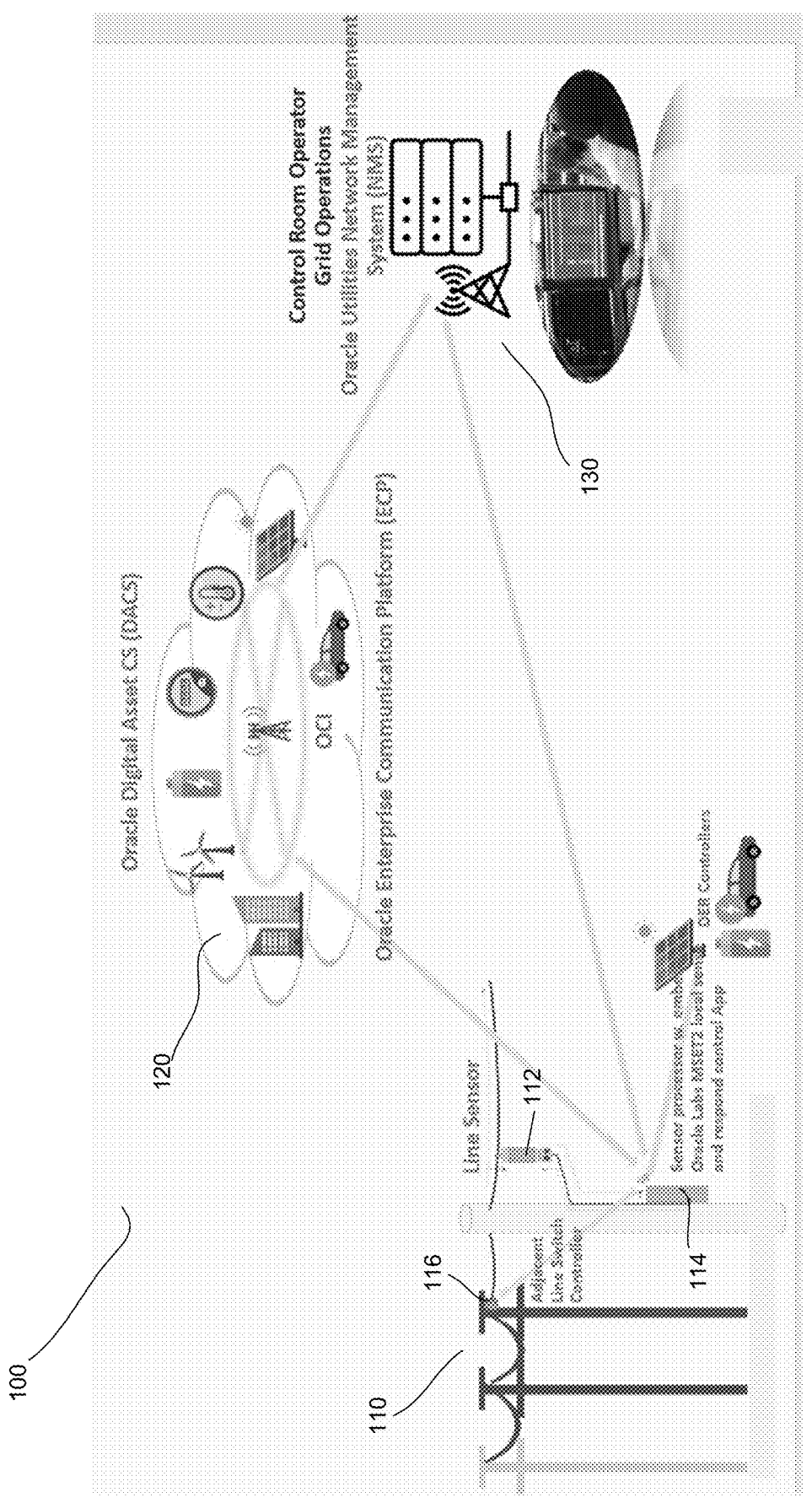
FIG. 1 is an overview diagram of a distributed electrical grid system that can implement embodiments of the invention.

FIG. 1 is an overview diagram of a distributed electrical grid system 100 that can implement embodiments of the invention. System 100 includes, at the electrical grid edge 110, a high speed sensor 112, a processor/controller based server 114 with embedded ML ("ML server") executing instructions, including machine learning, to perform event detection and mitigation functionality, and an adjacent line switch controller 116 to perform mitigation. In typical implementations, for a distributed electrical grid, depending on the size of the utility, there could be 100s or 1000s of sensor 112/ML server 114/switch controller 116 installations throughout their distribution grid.

System 100 further includes, remote from grid edge 110, a cloud based device management system 120 for remotely managing hardware and software for each device at grid edge 110. In one embodiment, device management system 120 is implemented, at least in part, using "Oracle Utilities Operational Device Management", from Oracle Corp., and is used to maintain information about assets and various features and functions around managing those assets, including recording asset acquisition, maintenance, procurement, installation and removal. In embodiments, device management system 120 is implemented on the Oracle Cloud Infrastructure ("OCI") from Oracle Corp. In embodiments, device management system 120 implements Oracle Utilities Digital Asset Cloud Service ("DACS"), from Oracle Corp., that provides the core functionality for utilities to create, run, and maintain demand response and distributed energy resource programs as part of a larger distributed energy resource management system ("DERMS"). In embodiments, device management system 120 further implements Oracle Enterprise Communication Platform ("ECP"), from Oracle Corp.

System 100 further includes a Network Management System ("NMS") 130, which is typically located on-premise at the utility that is managing the devices at grid edge 110 and provides outage management and advanced distribution management functions. In one embodiment, NMS 130 is implemented, at least in part, using "Oracle Utilities Network Management System", from Oracle Corp.

Figure 2:
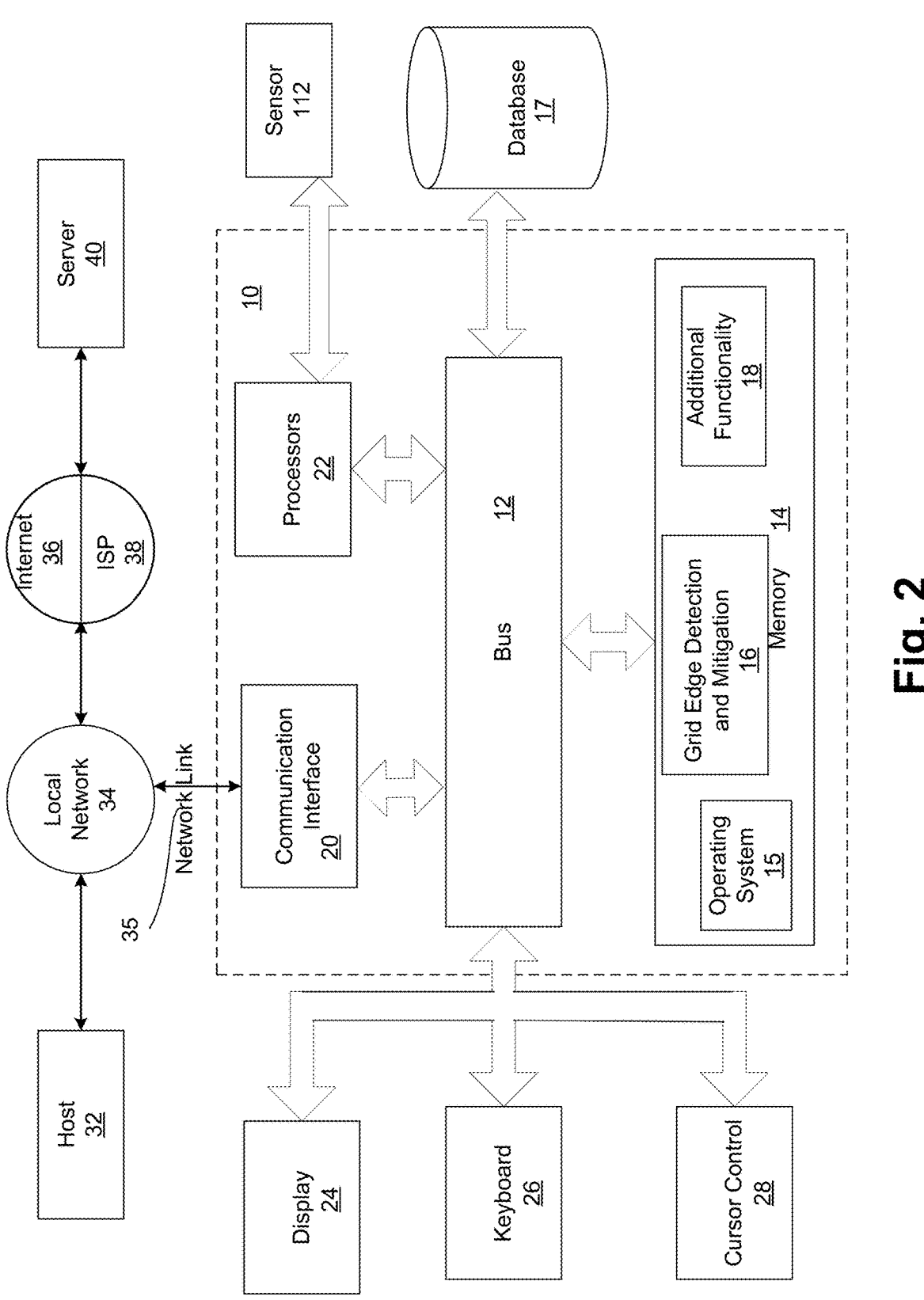
FIG. 2 is a block diagram of a computer server/system in accordance with an embodiment of the present invention that can be used to implement any of the functionality disclosed herein.

FIG. 2 is a block diagram of a computer server/system 10 in accordance with an embodiment of the present invention that can be used to implement any of the functionality disclosed herein. Although shown as a single system, the functionality of system 10 can be implemented as a distributed system. Further, the functionality disclosed herein can be implemented on separate servers or devices that may be coupled together over a network. Further, one or more components of system 10 may not be included. One or more components of FIG. 2 can also be used to implement any of the device/elements of FIG. 1.

System 10 includes a bus 12 or other communication mechanism for communicating information, and a processor 22 coupled to bus 12 for processing information. Processor 22 may be any type of general or specific purpose processor. System 10 further includes a memory 14 for storing information and instructions to be executed by processor 22. Memory 14 can be comprised of any combination of random access memory ("RAM"), read only memory ("ROM"), static storage such as a magnetic or optical disk, or any other type of computer readable media. System 10 further includes a communication interface 20, such as a network interface card, to provide access to a network. Therefore, a user may interface with system 10 directly, or remotely through a network, or any other method.

Computer readable media may be any available media that can be accessed by processor 22 and includes both volatile and nonvolatile media, removable and non-removable media, and communication media. Communication media may include computer readable instructions, data structures, program modules, or other data in a modulated data signal such as a carrier wave or other transport mechanism, and includes any information delivery media.

Processor 22 is further coupled via bus 12 to a display 24, such as a Liquid Crystal Display ("LCD"). A keyboard 26 and a cursor control device 28, such as a computer mouse, are further coupled to bus 12 to enable a user to interface with system 10.

In one embodiment, memory 14 stores software modules that provide functionality when executed by processor 22. The modules include an operating system 15 that provides operating system functionality for system 10. The modules further include a grid edge detection and mitigation module 16 that performs detection and mitigation of events at the electrical grid edge, and all other functionality disclosed herein. System 10 can be part of a larger system. Therefore, system 10 can include one or more additional functional modules 18 to include the additional functionality that can integrate with module 16. A file storage device or database 17 is coupled to bus 12 to provide centralized storage for modules 16 and 18, including training data, predefined spend classification categories, etc. In one embodiment, database 17 is a relational database management system ("RDBMS") that can use Structured Query Language ("SQL") to manage the stored data.

In embodiments, communication interface 20 provides a two-way data communication coupling to a network link 35 that is connected to a local network 34. For example, communication interface 20 may be an integrated services digital network ("ISDN") card, cable modem, satellite modem, or a modem to provide a data communication connection to a corresponding type of telephone line or Ethernet. As another example, communication interface 20 may be a local area network ("LAN") card to provide a data communication connection to a compatible LAN. Wireless links may also be implemented. In any such implementation, communication interface 20 sends and receives electrical, electromagnetic or optical signals that carry digital data streams representing various types of information.

Network link 35 typically provides data communication through one or more networks to other data devices. For example, network link 35 may provide a connection through local network 34 to a host computer 32 or to data equipment operated by an Internet Service Provider ("ISP") 38. ISP 38 in turn provides data communication services through the Internet 36. Local network 34 and Internet 36 both use electrical, electromagnetic or optical signals that carry digital data streams. The signals through the various networks and the signals on network link 35 and through communication interface 20, which carry the digital data to and from computer system 10, are example forms of transmission media.

System 10 can send messages and receive data, including program code, through the network(s), network link 35 and communication interface 20. In the Internet example, a server 40 might transmit a requested code for an application program through Internet 36, ISP 38, local network 34 and communication interface 20. The received code may be executed by processor 22 as it is received, and/or stored in database 17, or other non-volatile storage for later execution. Further, system 10 is coupled, either wired or wirelessly, to sensor 112, particularly when system 10 implements processor/controller system 110.

In one embodiment, system 10 is a computing/data processing system including an application or collection of distributed applications for enterprise organizations, and may also implement logistics, manufacturing, and inventory management functionality. The applications and computing system 10 may be configured to operate locally or be implemented as a cloud-based networking system, for example in an infrastructure-as-a-service ("IAAS"), platform-as-a-service ("PAAS"), software-as-a-service ("SAAS") architecture, or other type of computing solution.

As disclosed, there is a need to quickly detect and mitigate events that occur at the grid edge, such as a tree branch falling into a line or other grid disturbances that cause an imbalance of generation, with load leading to a under frequency condition if there is too much load and not enough generation or over frequency condition if there is too much generation and not enough load. These grid disturbances need to be mitigated very quickly to avoid system stability and relays opening interties that could lead to wide-spread system blackouts. The frequency violation can detected by the edge sensors and automatically mitigated by embodiments of the invention.

In general, embodiments centrally manage autonomous functionality (i.e., the combination of sensor 112 and ML server 114). ML server 114, at the grid edge, can detect an event and then send a notification of the event to an adjacent device (i.e., adjacent line switch controller 116) to provide mitigation control. Switch controller 116 can provide mitigation control by receiving the automated response control issued by the edge device 112 running the MSET2 detection (disclosed below) and associated autonomous If This Then That ("IFTTT") active network management response, as compiled by the central NMS 130 active network management function, managed by DACS and installed to the edge device by ECP. NMS operators also receive full situational awareness of the sensor measurements via supervisory control and data acquisition ("SCADA") reads and the ability for operators to lockout the Autonomic Network Management ("ANM"), autonomous response on the device if, for example, crews are working on the line or other abnormal network conditions.

The ANM scheme in embodiments could be to open to an adjacent distribution switch or to change the control settings of adjacent Distributed Energy Resource ("DER") devices operating envelopes to immediately either reduce load, from demand response or EV or other battery charging, and/or to inject power from EV or other battery stored energy to mitigate frequency disturbances for short durations of up to a few minutes.

In contrast, known solutions generally have to provide the detection of the event to cloud device management 120, or NMS 130, which then provides mitigation, thus leading to large latency via communication to the cloud and back, which is likely too late to mitigate the catastrophic damage of starting a wildfire or system stability collapse. Further, as the number of devices to be managed at the grid edge expand to 100s or 1000s of devices, a large scale event may require all devices to report to NMS 130 at approximately the same time, which may cause further gridlock and delay.

Line sensor 112, in embodiments, is a high speed optical accelerometer sensor having a sampling rate of 60 kHz or greater to generate a high frequency waveform to measure harmonics out to the 20th. In embodiments, sensor 112 is capable of 15,000 samples per cycle (i.e., 90,000 samples per second). In one embodiment, sensor 112 is implemented using the Micatu Optical Sensor technology from Micatu, Inc., specifically the Micatu m410 and m410b optical sensor signal processor platform, Archer hardware, compensation algorithms and communication and operating software and core operating software/firmware. Sensor 112 is designed for high-precision measurements in electrical power systems. Sensor 112, in embodiments, includes an optical head, a fiber optic cable, and a data acquisition unit (which may be implemented by ML server 114). The optical head captures the electromagnetic field generated by current and voltage signals in the power system and converts it into an optical signal. This signal is then transmitted through the fiber optic cable to the data acquisition unit, where it is converted back into electrical signals for further analysis and processing via ML server 114. Sensor 112 provides real-time measurements without the need for physical connections to the electrical conductors, and can measure parameters such as voltage, current, power quality, and harmonics.

In other embodiments, sensor 112 can be any type of accelerometer/vibration sensor, including a uni-axial (i.e., one directional) accelerometer or a tri-axial accelerometer (i.e., measuring high-frequency displacements in, for example, up/down direction, left/right, side-to-side simultaneously) to detect debris (e.g., a tree branch) hitting it or a falling pole/conductor. In another embodiment, high-voltage conductors that create vibrations are also known to create an audible "hum" and the combination of mathematical and machine-learning techniques disclosed herein will work equally well with all classes of acoustic and ultrasonic microphones.

ML server 114 receives output data from sensor 112 and performs anomaly detection using machine learning. In one embodiment, the ML is implemented using the advanced prognostic pattern recognition technique of the Multivariate State Estimation Technique ("MSET", "MSET2", etc., collectively "MSET" or "MSET2" or generally a "pattern recognizer") from Oracle Corp. MSET2 is a system that analyzes single or multiple digitized signals monitoring a process or system. These signals are used to determine the current condition or detect anomalies of a system (e.g., the electric distribution network) and to validate the accuracy of the monitoring sensor signals. However, because of the high frequency waveforms being generated by sensor 112, embodiments incorporate a novel transformation of the data output by sensor 112 before being received by ML server 114 and processed by the ML. MSET2 is an advanced statistical pattern recognition technique that comes from the class of mathematics called nonlinear nonparametric ("NLNP") regression. Although MSET2 is used in embodiments as the ML, other NLNP techniques that can be used in other embodiments include neural networks, support vector machines, and autoassociative kernel regression. MSET2 can analyze the correlation patterns among various received signals, and trigger an alarm for anomaly detection at the earliest onset of a change in those patterns, and with ultralow false-alarm and missed-alarm probabilities. However, because of the high frequency waveforms being generated by sensor 112, embodiments incorporate a novel transformation of the data output by sensor 112 before being received by ML server 114 and processed by the ML.

Specifically, conventional high frequency waveforms such as from accelerometers (i.e., vibrations) directional microphones, ultrasound transducers, etc., are only leveraging a tiny fraction of the information content in terms of prognostics. Prior art condition monitoring with ultra-high frequency waveforms will typically pass the waveform through a Fast Fourier Transform ("FFT") algorithm, identify peaks in the power-spectral-density ("PSD") during normal operation, and place thresholds on the peaks to generate an alarm if vibrational or acoustic-pressure amplitudes should exceed the thresholds. In reality, such threshold-based alerts are not really proactive, but instead are reactive in the sense that the degradation has to already be fairly severe to trip a threshold.

Further, threshold-based health monitoring suffers from an endemic costly tradeoff between false-alarm probabilities ("FAP"s) and missed-alarm probabilities ("MAP"s). When high-frequency waveforms are monitoring critical infrastructure assets, if there is a desire to get earlier warnings of the incipience or onset of anomalous behavior, the thresholds are lowered. However, when monitoring noisy physics waveforms that contain superimposed measurement noise, lowering the thresholds to gain earlier warning alarms can cause spurious trips from noise values at the edge of the histogram, leading to elevated FAPs. For electricity distribution assets and infrastructure, false alarms can be very costly. To avoid the costs associated with false alarms, the thresholds can be raised, but then the degradation is more severely underway, or the asset has already failed, before any alarms are actuated.

With NMS, grid operators are always in control having full situational awareness of the sensors and the ability to set the automated response operation, as well as tag-out/lock-out the automated operations if crews are working in the area. However, with conventional known health monitoring of gross signal amplitudes, elevated FAPs can be very costly (e.g., dispatching utility emergency repair crews unnecessarily only to discover the assets are fine, but random measurement noise triggered false alarms), and elevated MAPs can be catastrophic.

In contrast, embodiments integrate a real-time or near real-time ML prognostic algorithm (e.g., MSET) in sensor firmware with the digital signal processing for the optical current/voltage sensor so that there are no data-networking/IO delays getting the real-time signals to the ML prognostic algorithm as there is in a conventional "producer/consumer" data flow architecture. In embodiments, this is implemented, as disclosed in detail below, by hosting the MSET2 detection and IFTTT ANM anomaly response directly on (or connected to) the sensor processor running in the same box on the pole or utility equipment for very fast detect and autonomous response to mitigate the impacts of the disturbance before it becomes catastrophic. The DACS/MSET Cloud Device Management and NMS real-time control system enables device configuration for the specific distribution network configuration managed in NMS and gives an operator situational awareness and control over the distributed ANM schemes.

Further, in embodiments, the optical sensor waveform generated by sensor 112 is being "instantly" transformed (i.e., between digitizing increments, so it keeps up with real-time stream rates) into equally-spaced frequency bands (e.g., 10 bands, or a number within a range of 6-12 bands, or a wider range, as long as the number of bands is not too small so that the MSET's prognostic performance does not decrease, and not too large which is restricted by the computing resources) to produce corresponding correlated digitized time series. The digitized time series are processed as they are produced, in near real-time (i.e., millisecond latencies for the transformation) by a pre-trained multivariate model (e.g., MSET2), for near-instantaneous prognostics of the dynamic waveforms, to detect the incipience or onset of the "leading edge" of any degradation modes that: (1) can compromise the integrity of the solid conductor, to actuate a de-energization signal immediately to an up-stream feeder substation and shut off the current before the conductor hits the ground to bring electrocution hazards to humans and possibly trigger wild fires; and (2) would maintain grid stability by controlling nearby smart inverters distributed energy resources ("DER") controllers to inject current and control voltage, enabling "synthetic inertia" to mitigate the grid disturbance before the grid falls apart.

Figure 3:
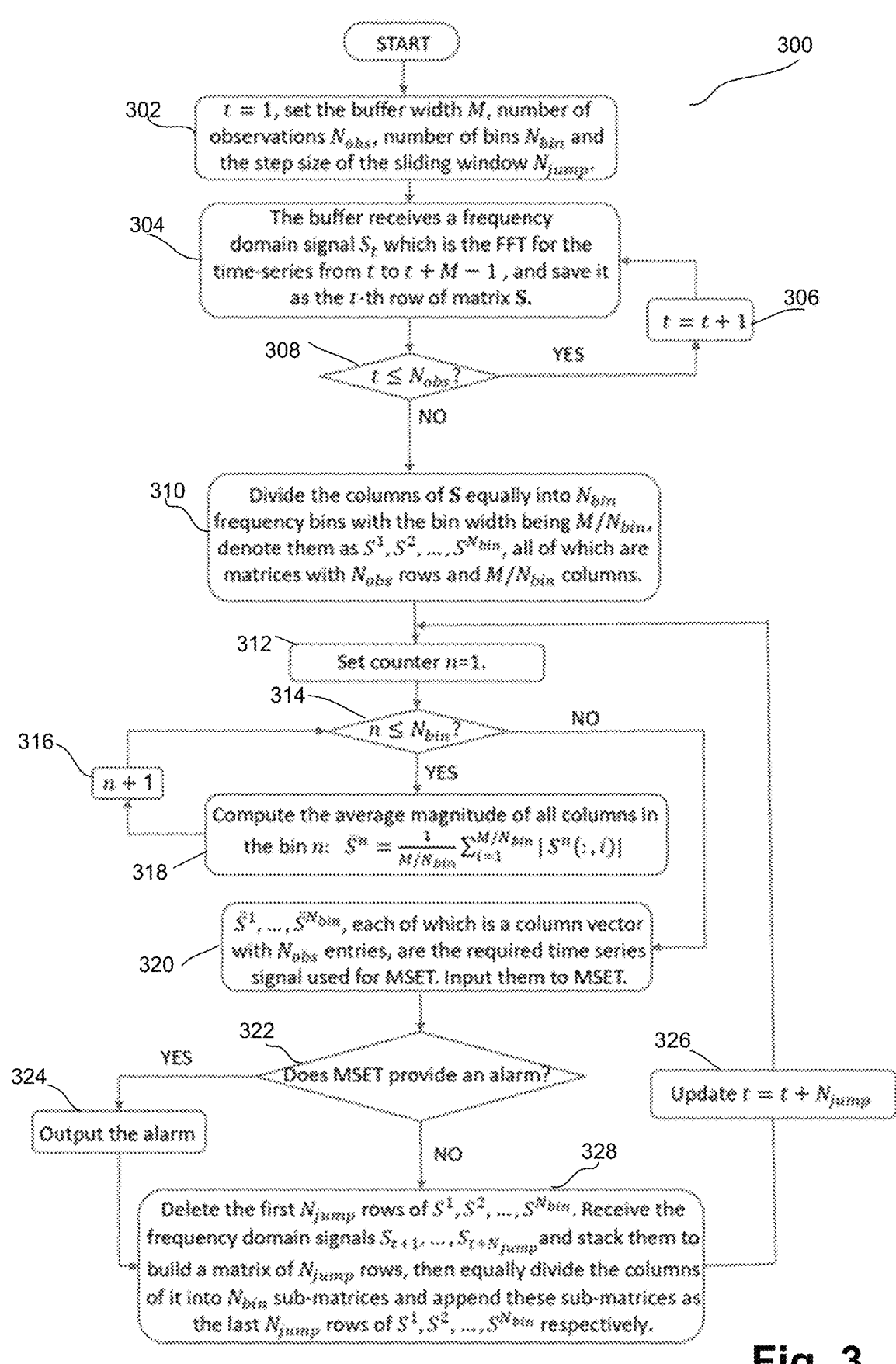
FIG. 3 is a flow/block diagram of functionality of the grid edge detection and mitigation module of FIG. 2 when detecting and mitigating events at the electrical grid edge in accordance with embodiments.

FIG. 3 is a flow/block diagram of functionality 300 of grid edge detection and mitigation module 16 of FIG. 2 when detecting and mitigating events at the electrical grid edge in accordance with embodiments. FIG. 3 illustrates the functionality for a single-axis or uni-axis accelerometer. In one embodiment, the functionality of the flow diagram of FIG. 3 (and FIGS. 5-10 below) is implemented by software stored in memory or other computer readable or tangible medium, and executed by a processor. In other embodiments, the functionality may be performed by hardware (e.g., through the use of an application specific integrated circuit ("ASIC"), a programmable gate array ("PGA"), a field programmable gate array ("FPGA"), etc.), or any combination of hardware and software.

Functionality 300 transforms in real-time raw sensor waveform from sensor 112 into multiple frequency bands, and digitizes the separate bands at a lower output sampling rate (e.g., 1-2 KHz) for each independent band (e.g., 10 bands in one embodiment). This in effect turns the sensor 112 firmware into a 10-time-series prognostic algorithm that is monitoring the correlation patterns among the 10 time-series bands, using a "pre-trained" model (e.g., MSET model at ML server 114 trained off-line with known good conductors and stored in firmware) for "near-real-time" condition inferencing with extremely low latencies.

Functionality 300 begins at 302 where parameters are set, including time index t=1, buffer width M, number of observations stored in the buffer $N_{obs}$, number of bins $N_{bin}$ and the step size of the sliding window $N_{jump}$. In one embodiment, $N_{obs}$=1000, M=100, $N_{bin}$=10 and $N_{jump}$=200.

At 304, the buffer receives the raw sensor waveform from sensor 112 in the form of a frequency domain signal $S_t$. An empty matrix S with M columns and $N_{obs}$ rows is initialized. Its t-th row is filled using frequency domain signal $S_t$ (a row vector with M entries) which is the FFT of the streaming time-series starting from t to t+M−1.

At 308, while t≤$N_{obs}$, at 306 increase t by t=t+1, and repeat 304 again. When t>$N_{obs}$, that means the S is already fully filled and functionality continues at 310.

At 310, the columns of S are divided equally into $N_{bin}$ frequency bins with the bin width being $M/N_{bin}$, and denoted as $S^1, S^2, \ldots, S^{N_{bin}}$, all of which are matrices with $N_{obs}$ rows and $M/N_{bin}$ columns. After 310, functionality 300 has been initialized.

At 312 the bin counter is set to n=1.

At 314, while $n \leq N_{bin}$, at 318 the average magnitude of all columns in the n-th bin is determined by:

$$\overline{S}^n = \frac{1}{M/N_{bin}} \sum_{i=1}^{M/N_{bin}} |S^n(:, i)|.$$

At 316, n is increased by n=n+1.

When $n > N_{bin}$, that means the column-wise average magnitude of all the $N_{bin}$ partitions of S has been computed. Functionality continues at 320.

At 320, the $\overline{S}^n$ for n=1, . . . , $N_{bin}$ obtained from 318 are the required time-series used for MSET. The time series is input to MSET (or other ML in other embodiments). At 322, it is observed whether the MSET provides any alarm (i.e., detects an anomaly).

If there are alarms at 322, at 324 the alarms are output.

If no alarms at 322, at 328, delete the first $N_{jump}$ rows of $S^1, S^2, \ldots, S^{N_{bin}}$ Receive the frequency domain signals $S_{t+1}, \ldots, S_{t+N_{jump}}$ and stack them to build a matrix of $N_{jump}$ rows, then equally divide the columns of it into $N_{bin}$ sub-matrices and append these sub-matrices as the last $N_{jump}$ rows of $S^1, S^2, \ldots, S^{N_{bin}}$ respectively. After this step, the size of $S^1, S^2, \ldots, S^{N_{bin}}$ should not be changed.

At 326, increase t by $t=t+N_{jump}$. Functionality then continues at 312 as more data from sensor 112 is received so that functionality 300, after initialization, runs continuously.

Functionality 300 is adapted for a uni-axial embedded accelerometer and associated digital signal processing ("DSP") sensor, but for embodiments it can be modified to be used to "concurrently" process bi-axis or tri-axis accelerometer signals in parallel on a multi-core processor. Specifically, for a 2-axis or bi-axis accelerometer that measures vibrations in the X-Y directions in a plane (e.g., measuring the radial vibrations from a vertical-shaft rotating machine, such as a wind turbine), then the two axes for the bi-Axis accelerometer are sampled concurrently, and the functionality of FIG. 3 is applied to the outputs from the two sensors concurrently. The end result of this bi-axis concurrent processing is the following: FIG. 3 produces $N_{bin}$ time series signals. For a bi-axis accelerometer, running FIG. 3 concurrently on the outputs of the 2 sensors produces $2*N_{bin}$ time series. Subsequent anomaly detection surveillance with MSET will now be consuming $2*N_{bin}$ time series.

Similarly, for 3-axis or tri-axis accelerometers, which have 3 sensors measuring the X, Y, and Z dimensions, all of which are sampled concurrently, the functionality of FIG. 3 is applied concurrently to the outputs of the 3 sensors, producing $3*N_{bin}$ time series signals.

As a typical example, in one embodiment, 20 is used for $N_{bin}$. Therefore, the FFT "amplitude vs frequency" waveforms are broken into 20 equally spaced frequency bins, which produces 20 time series signals that are monitored by MSET.

Per the above, when there are bi-axial sensors, the "frequency-domain-to-time-domain" functionality in FIG. 3 is implemented on each sensor concurrently, producing 40 synchronous time series signals to be monitored by MSET.

For tri-axis accelerometers, functionality in FIG. 3 is implemented concurrently on all 3, producing in this example 60 time series signals monitored by MSET for anomaly detection. Note that this comprehensive model will catch the early onset of subtle leading-edge degradation modes whether they impact only one dimension, or any two dimensions, or all 3 dimensions.

Referring again to FIG. 1, each device 112, 114 and 116 in embodiments is a software configurable data telemetry device, which can measure various inputs not only from high speed optical sensors 112, but can also bring in data from legacy line sensors and other input devices. This would include support for legacy sensors included with power-transformer, current-transformer and other electrical based sensors.

The combination of edge data telemetry device for optical sensors, and extendable to other sensors, enables the dynamic and reactive flow of information for both prognostic machine learning at a local and cloud level. This enables "hive" through localized learning that is also provided to the cloud for global learning and model feedback, reporting and reaction to real time events for high speed autonomous grid operation. In addition, embodiments have the capability to sample, process and react at a local location (on the distribution feeder), with the potential for localized clustering in the event of communication loss to the cloud or unit failures due to faults.

Various outputs of analog or digital signals would enable the control of utilities devices, for Volt-Ampere Reactive ("VAR") violation-based selectionization or other control devices. Each device in embodiments is configurable via a local device and/or the cloud digitally and can change behavior based on machine learning from local or cloud sources. This enables low point-of-entry cost to have a predictive response rather than reactive from both new and existing utility assets. In embodiments, edge data telemetry device 114 has a small form factor which allows for mounting in the field, with any modern multi-core multi-thread CPU or GPU processor for high-speed fine-grain parallel processing with the MSET2 ML pattern recognition algorithm. MSET or MSET2 is a deterministic mathematical algorithm that parallelizes naturally on all modern multi-threading CPUs and GPUs. MSET2 is a class of nonlinear nonparametric ("NLNP") regression algorithms. Neural Networks ("NN"s) and Support Vector Machines ("SVMs") are also NLNP regression algorithms, but do not parallelize with fine-grain thread-level parallelism because of the stochastic optimization of the weights in NNs and SVMs.

In embodiments, based on a mass deployment of edge data telemetry devices, events will propagate through and can provide feedback loops and near real time information for the control of parts of the grid yet to be affected. This adds value as existing deployed assets are leveraged by using the edge data telemetry devices. For example, a tornado in Texas can allow protective measures in Oklahoma for autonomous grid operation.

As more points and information is added to the "Hive," its ability to predict and react with higher performance through data hygiene and applications such as MSET2 would operate locally and provide a feedback loop to the cloud for additional, group learning.

Figure 4:
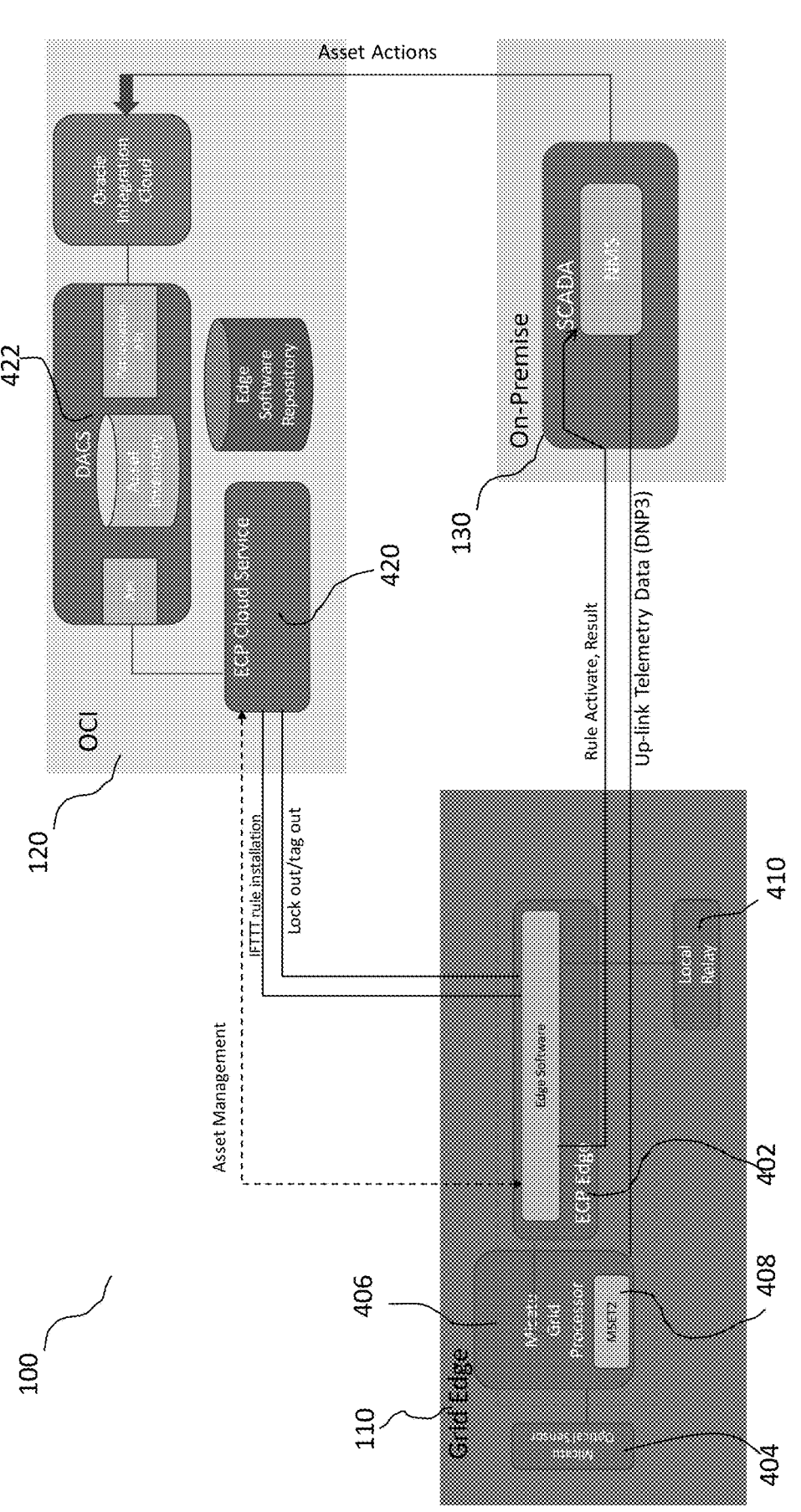
FIG. 4 is a block diagram of the system in accordance with embodiments.

FIG. 4 is a block diagram of system 100 in accordance with embodiments. System 100, as disclosed, responds to critical faults as well as a potential fault in the electrical/power grid by placing intelligent software as physically close as possible to the potential fault, referred to in FIG. 4 as "Grid Edge", as well as potential fault mitigation locations which allows for real-time prediction/detection of faults as well as low-latency fault mitigation actions to prevent further damages causes by the fault.

System 100 includes the ability to host and remotely life-cycle manage edge software, implemented on ML server 114 as well as on ECP Edge hardware 402, deployed in the field at the Grid Edge. System 100 includes the ability to detect an event/anomaly as well as autonomously activate proper "If This Then That" ("IFTTT") rule(s) accordingly. System 100 includes the ability for NMS 130 to lock-out an IFTTT rule based on Tag-out commands from NMS 130.

In the embodiments shown in FIG. 4, system 100 includes sensor 402, or sensor 112, an optical sensor, and a signal processing platform referred to as a Grid Processor 406, from Micatu, Inc., or ML server 114. In embodiments, the ML (i.e., MSET 408) is executed by Grid Processor 406.

System 100 further includes an Enterprise Communication Platform ("ECP") Edge 402 Platform from Oracle Corp., which is an ECP Edge software running on a computing hardware. It provides hosting and life-cycle-management of application software workload deploying at the grid edge. ECP Edge 402 is part of the ECP Cloud service 420 from Oracle Corp.

System 100 further includes a local relay 410, which represents an actionable local device for mitigating a fault (e.g., line switch controller 116). Local relay 410 provides functionality of local preventive action that NMS 130 can take in response to an anomaly detected by MSET2 408. In embodiments, local relay 410 can be implemented by an oil-filled circuit breaker, high voltage switch, etc.

NMS 130 in embodiments includes a supervisory control and data acquisition ("SCADA") and functions as a grid management platform. Platform 130 makes decisions based on the type of anomaly detected by MSET2. The NMS, if warranted, can issue mitigating actions to ECP Edge 402 so that local mitigating actions can be performed.

ECP Cloud Service 420 is the core service of ECP running on the OCI cloud 120. ECP Cloud 420 works in conjunction with ECP Edge 402 to carry out DAC's tasks. In this project, the tasks will evolve around the Assets management actions as well as Anomaly detection actions.

System 100 further includes Digital Asset Cloud Service ("DACS") 422, which manages that grid's assets deployed by a utility operator. DACS 422, working in conjunction with ECP, also carries out actions issued by NMS 130.

Use Cases

Embodiments include use cases that generally fall into the below categories, disclosed in detail below:
1) Asset Management Use Case—Allows DACS 422 to performs audits, as well as updating of, information within its inventory database against what is in the field.
2) Anomaly detection and local actions—Performing real-time anomaly detection and carrying out any mitigation actions at the grid-edge.

Use Case 1: Auditing of Grid Assets

This use case involves auditing information in the DACS inventory against what is reported from the field. For example, the use case can be used to ensure that the software version running on the sensing device 112 in the field is consistent with the information in the DACS's inventory database. In addition, additional information can be gathered from the field to enhance the richness of information in the inventory database. In addition to the software version, information about the health of the device such as up-time/ down-time, CPU utilization, memory utilization and more can also be obtained, when available, to enhance the asset inventory.

Figure 5:
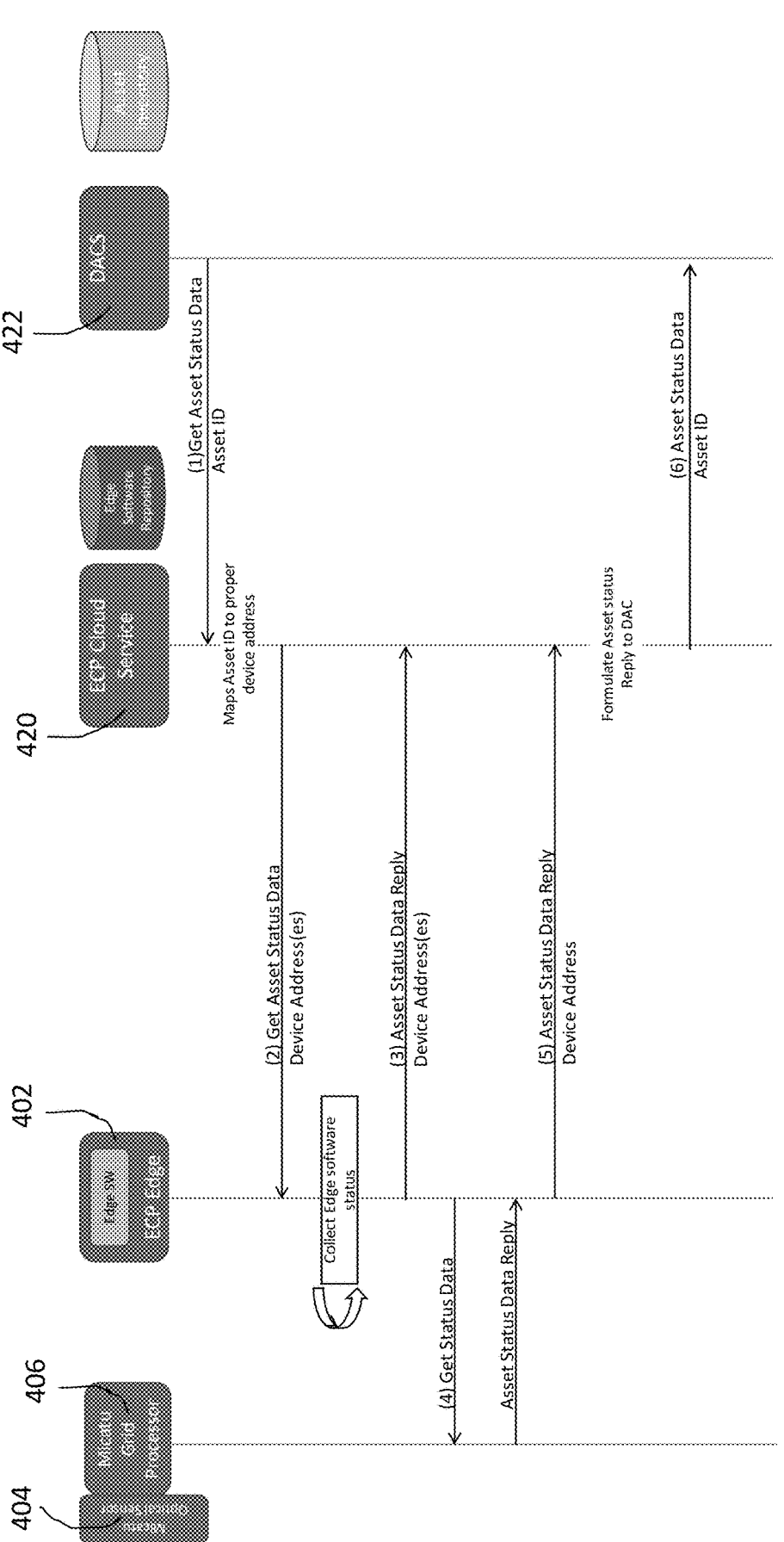
FIG. 5 is a flow diagram of functionality for the use case of auditing grid assets in accordance with embodiments.

FIG. 5 is a flow diagram of functionality for the use case of auditing grid assets in accordance with embodiments. The functionality of FIG. 5 includes the following:
1) DACS 422 determines that it is time to perform assets audition. This may be based on time of day ("ToD"), day of week ("DoW"), sector-by-sector, etc. DACS 422 sends out an Asset Information Request with the device ID in the Inventory database to the ECP cloud service 420.
2) ECP Cloud service 420 receives the Asset Information Request from DACS 422. The ECP cloud provides the requested information if it already have that information available at the time of DACS' request. Otherwise, it translates the request into the appropriate device address and forwards the request to the ECP Edge 402.
3) If the ECP Edge already has the information requested (i.e., device ID/Address happens to be of the software running on the ECP Edge), then it fetches the information and send the response back to the DACS via ECP Cloud 420.
4) If the ECP Edge 402 does not have the information, it will query the device in question (based on the Device ID/Address) for the information.
5) Once the ECP Edge 402 receives the requested information from the device, it sends the response back to the DACS via the ECP Cloud.
6) ECP Cloud 420 formulates the proper response back to the DACS.
7) DACS receives the up-to-date information about the device. DACS may decide to take management actions, such as initiating software update process, or simply update the inventory database with the updated information.

Use Case 2: Software Update for a Device at the Grid Edge

This use case involves remotely updating device software in the field at the Grid Edge. If and when DACS wants to update the software for a particular device, it can simply send the request to the ECP Cloud. There will be a firmware/software image repository at ECP that holds the approved firmware/software. This repository is hosted by the OCI cloud and can be managed by DACS or some other means.

If able, the ECP Edge will update the grid-edge software with the version dictated by DACS. If the ECP Edge is not able to update the device's software directly, it will send out requests to the device to perform its own software update. DACS will receive a message from the ECP Edge indicating the success or failure of the software update.

Figure 6:
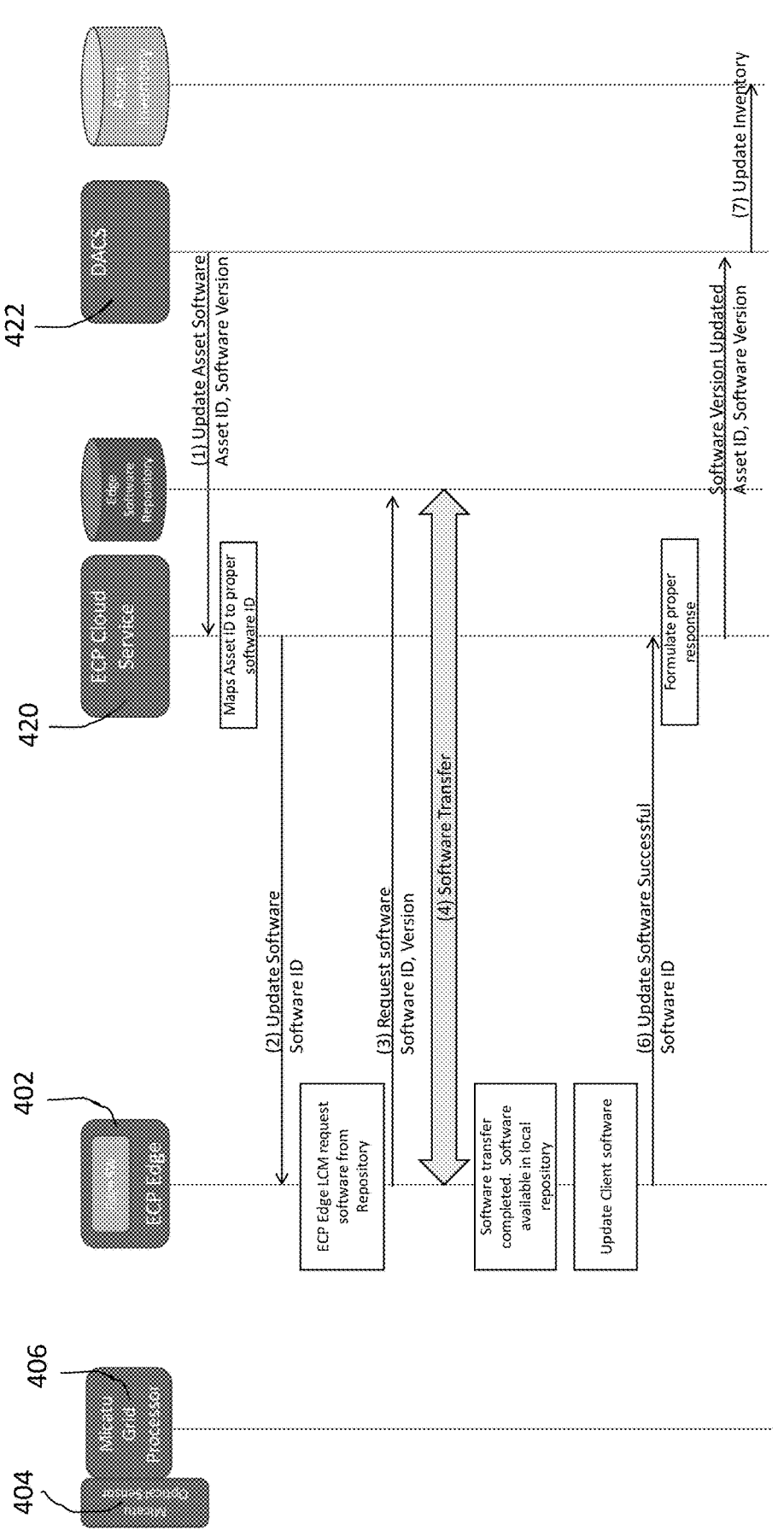
FIG. 6 is a flow diagram of functionality for the use case for software updates for a device at the grid edge in accordance with embodiments.

FIG. 6 is a flow diagram of functionality for the use case for software updates for a device at the grid edge in accordance with embodiments. The functionality of FIG. 6 includes the following, where the ECP Edge life-cycle management has the ability to update firmware/software of the target device:
1) DACS 422 determines that it is time to perform software that is running on a device at the Grid-edge. It sends out a Software Update Request to the ECP cloud 420.
2) ECP Cloud service 420 receives the Software Update Request from DACS and translates the request into appropriate device address and forwards the request to the ECP Edge 402.
3) Upon reception of the Software Update Request, EPC Edge 402 fetches firmware/software image from the repository in the OCI cloud. The software version to fetch comes from the Software Update Request received prior.

4) Secure and error-check transfer of software image begins.

5) Once the ECP Edge 402 receives the completed without-error target firmware/software image, it proceeds to update the firmware/software for the target.

6) Once the software update is completed and the health check is performed successfully, ECP Edge 402 sends the Software Updated Success message back to the ECP Cloud 420 for relaying the message to the DACS 422.

7) DACS 422 updates the inventory database with the updated version number information for the asset.

Use Case 3: Asset Management (Update Edge Software)

Figure 7:
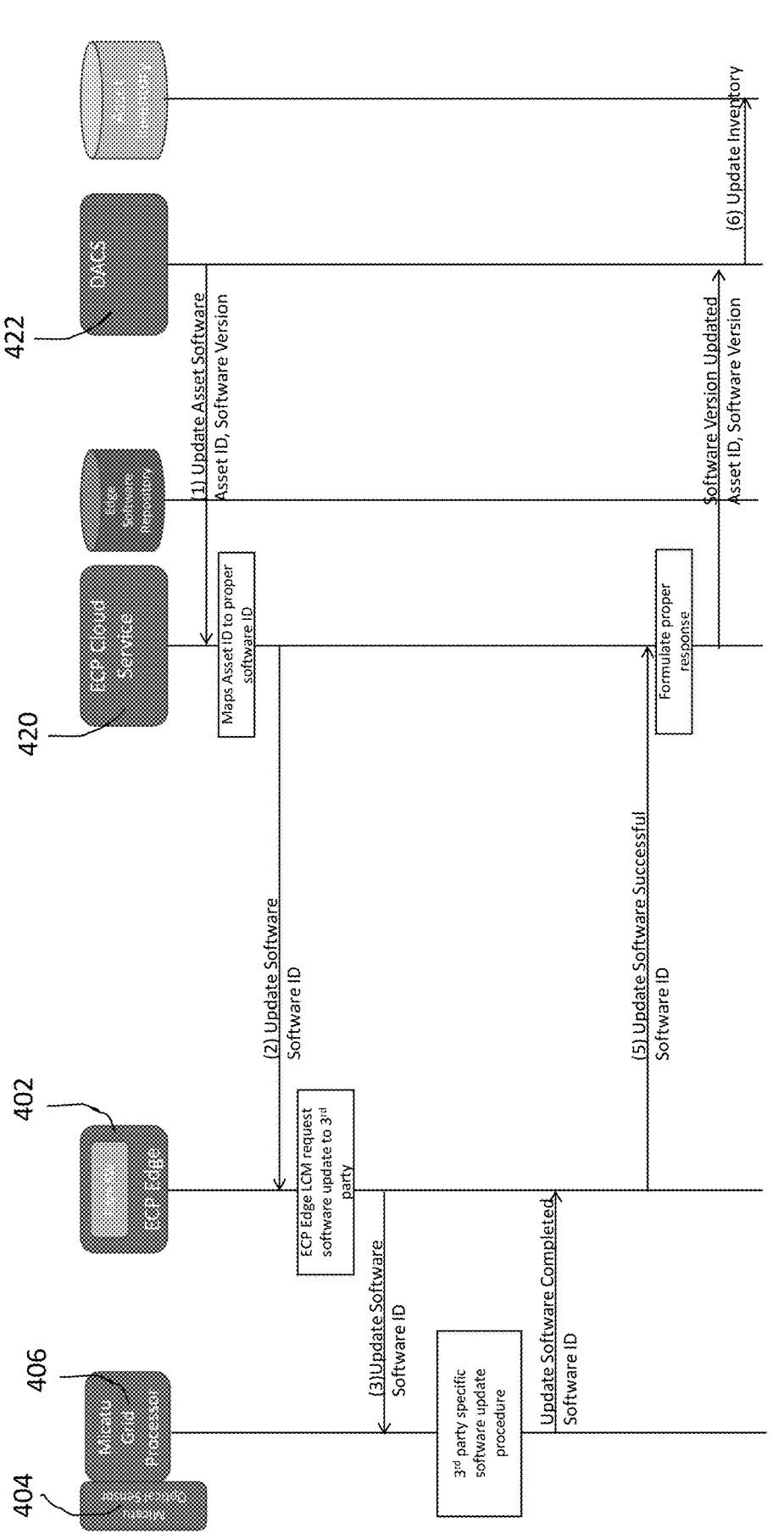
FIG. 7 is a flow diagram of functionality for the use case for asset management in accordance with embodiments.

This is the case where the ECP Edge LCM does not have the ability to update firmware/software of the target device. FIG. 7 is a flow diagram of functionality for the use case for asset management in accordance with embodiments. The functionality of FIG. 7 includes the following:

1) DACS 422 determines that it is time to perform software that is running on a device at the Grid-edge. It sends out a Software Update Request to the ECP cloud 420.

2) ECP Cloud service 420 receives the Software Update Request from DACS 422 and translates the request into the appropriate device address and forward the request to the ECP Edge 402.

3) Upon reception of the Software Update Request, ECP Edge 402 notifies the target 3rd party device to update itself with the firmware/software specified within the Software Update Request from DACS.

4) The third party device updates its own Firmware/Software.

5) Once the software update is completed and the health check is performed successfully, the 3rd party device sends a confirmation to the ECP Edge 402. The ECP Edge sends the Software Updated Success message back to the ECP Cloud for relaying the message to the DACS.

6) DACS updates the inventory database with the updated version number information for the asset.

Use Case 4-6: Grid Edge Anomaly Detection and Mitigation

Use cases 4-6 involve the real-time detection of events/anomalies from the sensor data of sensor 112 (or sensor 404) and, if necessary, making appropriate real-time mitigating actions autonomously, all occurring at the grid edge 110. The three use cases include:

Use Case 4: Installation of If-this-then-that ("IFTTT") autonomous rules at the grid edge. This use case allows either the NMS or DACS to install one or more IFTTT rule(s) at the grid edge. This IFTTT rule allows actions to be taken based on anomaly type(s) detected by the MSET2 algorithm.

Use Case 5: This use case describes a series of events after MSET2 detects one or more anomalies. Once an anomaly is detected, an appropriate IFTTT rule(s) is triggered based on the type(s) of anomaly detected. IFTTT rules that match the reported anomaly type, it will get triggered and actions defined within the triggered IFTTT rule will get "activated" providing that there is no "lock-out" action.

Use Case 6: This use case describes how the NMS can prevent the IFTTT activation from taking autonomous local action by setting the "Lock-out" flag.

Figure 8:
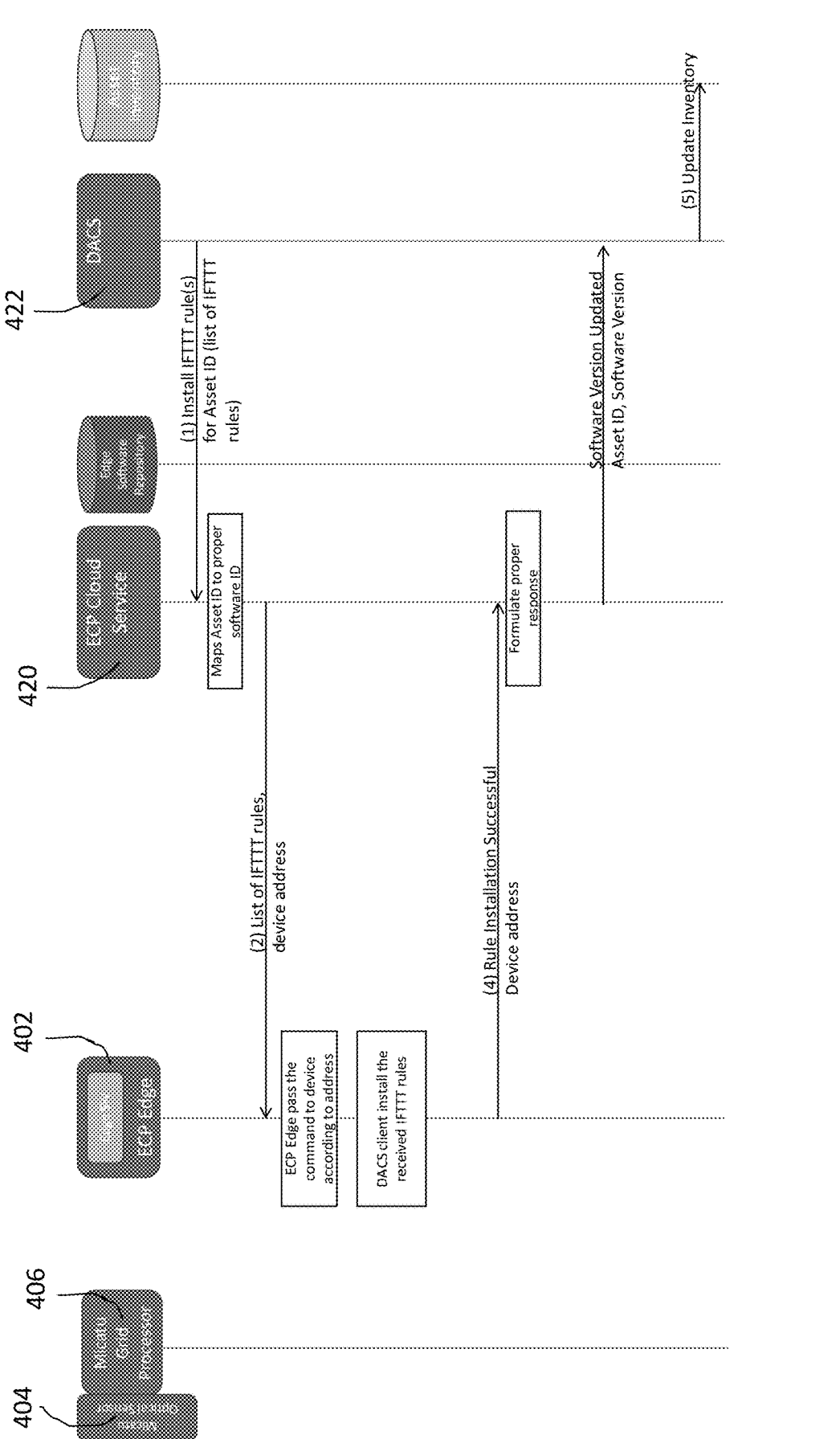
FIG. 8 is a flow diagram of functionality for the use case for anomaly detection using IFTTT rule installation in accordance with embodiments.

FIG. 8 is a flow diagram of functionality for the use case for anomaly detection using IFTTT rule installation in accordance with embodiments. The functionality of FIG. 8 includes:

1) DACS 422 determines that it is time to install a set of IFTTT rules onto a device/software client at the Grid Edge. It formulates a request to send to the ECP 420 that includes:
Assets ID;
List of IFTTT rule(s).

2) ECP 420 maps Assets ID to appropriate physical destination address and forward the IFTTT rules(s) to the ECP Edge 402 along with the destination address.

3) ECP Edge 402 receives an inbound request and determines that the destination address belongs to the software running on the ECP Edge. It then forwards the IFTTT rules to the appropriate edge-software.

4) A report is send to the DACS indicating successful installation of IFTTT rule(s).

5) The Inventory database is updated accordingly.

Figure 9:
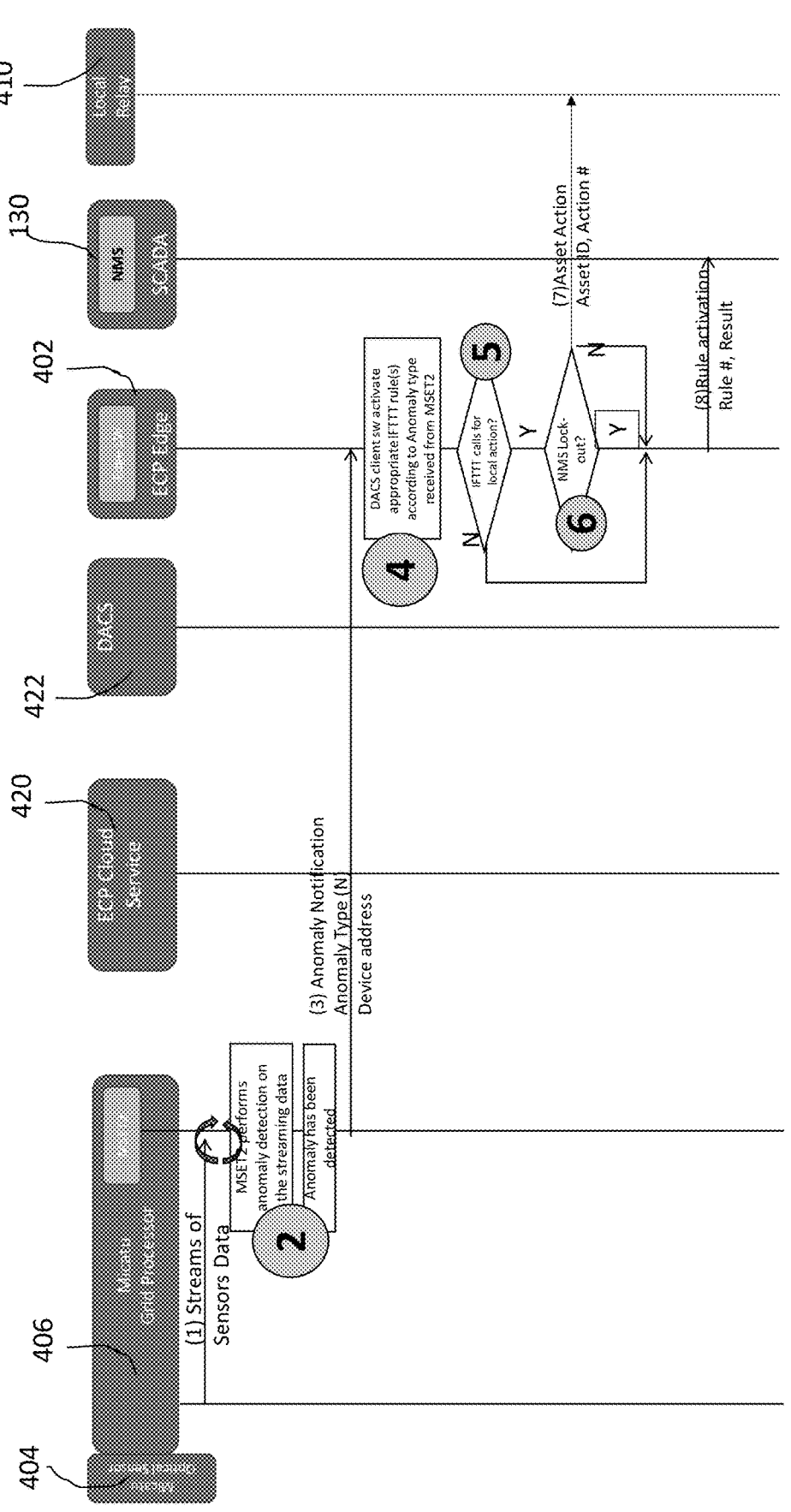
FIG. 9 is a flow diagram of functionality for the use case for anomaly detection and mitigation in accordance with embodiments.

FIG. 9 is a flow diagram of functionality for the use case for anomaly detection and mitigation in accordance with embodiments. The functionality of FIG. 9 includes:

1) Sensor 404 continuously sends the sensor stream data to the MSET2 algorithm.

2) MSET2 (running either on the ECP Edge 402 or on the grid processor 406) analyzes the sensor's data streams for any anomaly.

3) Anomaly has been detected by the MSET2 algorithm. The edge software running on the ECP Edge is notified along with the detected anomaly types.

4) The edge software activates proper IFTTT rule(s) (installed in previous use case) according to the received anomaly type.

5) The activated IFTTT rules may call for mitigation action by actuating a local relay or other mitigation device. If this not the case, then DACS client proceeds to notify the NMS of IFTTT rule activation event along with any appropriate activation results.

6) If the IFTTT rule calls for a local action (e.g., actuating a local relay), the edge software must consult to see if the NMS has "Lock-out" for this local action.

7) If there is no "Lock-out" condition, then the local relay is actuated. Upon successful actuation of the local relay, the NMS is notified of the IFTTT rule activation event along with any appropriate activation results. If there is a "Lock-out" condition, then the edge software will not actuate the local relay.

8) Autonomous rule activation notification along with appropriate results is forwarded to the NMS.

Figure 10:
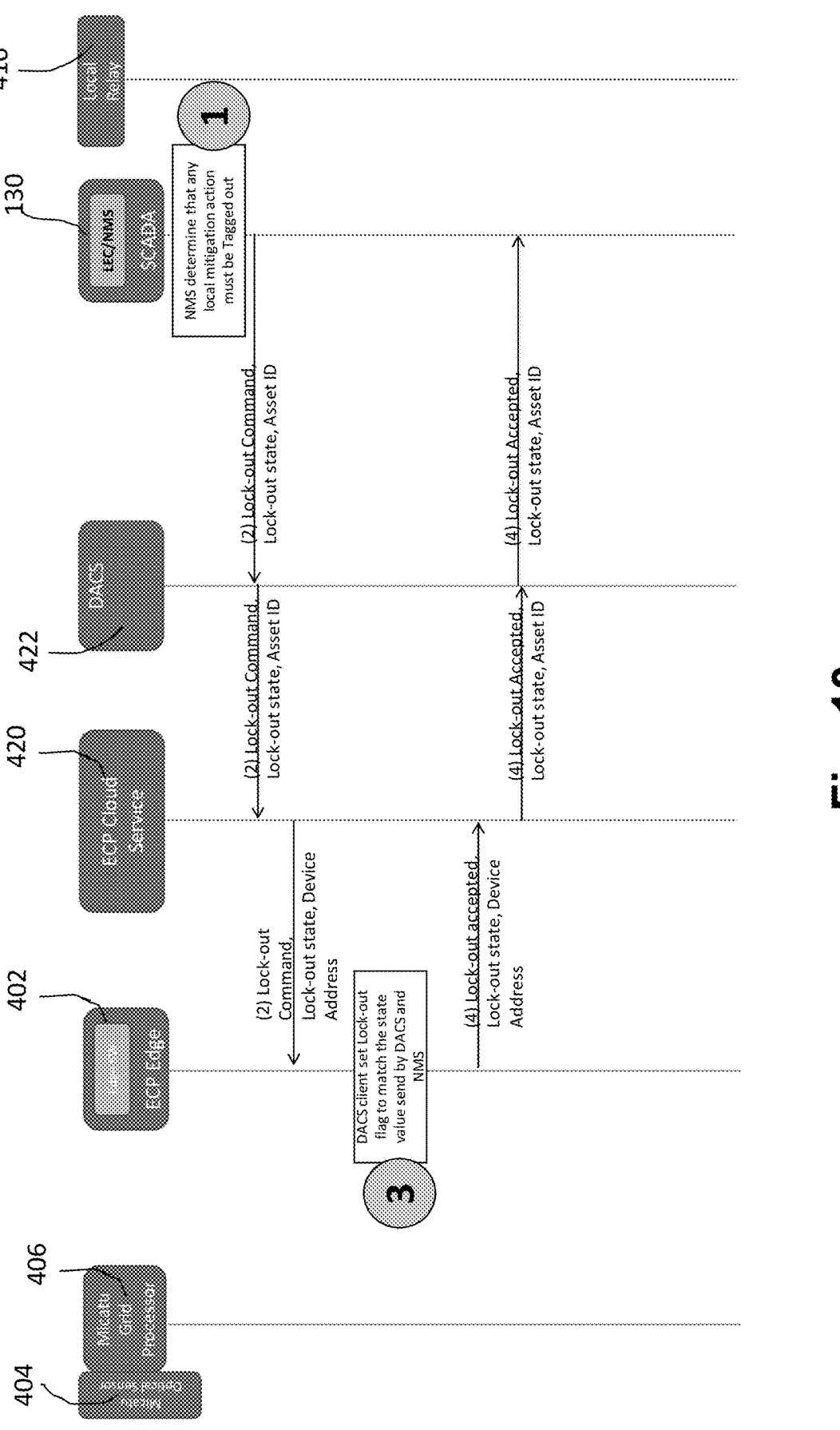
FIG. 10 is a flow diagram of functionality for the use case NMS set lock-out flag in accordance with embodiments.

FIG. 10 is a flow diagram of functionality for the use case NMS set lock-out flag in accordance with embodiments. The functionality of FIG. 10 includes:

1) The NMS 130 determines that a local mitigation action at a grid-edge must be "locked-out" due to some on-going maintenance work (or any other reasons).

2) The NMS sends the lock-out command to DACS. DACS determine the appropriateness of the command and forwards the command to the target ECP Edge via ECP Cloud services.

3) ECP Edge receives an inbound request and determines that the destination address belongs to the DACS client running on the ECP Edge. It then forwards the request to the DAC client. The DACS client sets the Locked-out flag to the state value send by DACS/NMS.

4) DACS client sends lock-out command accepted notification back to DACS.

As disclosed, embodiments integrate an advanced pattern recognition algorithm (i.e., MSET) or other pattern recognizer and a Situational Awareness Network Management System (i.e., NMS). MSET2 is an advanced pattern recognition ML algorithm that has generally only been deployed as a "consumer process" that would process data from a "producer" process in a "producer/consumer" networked data flow structure, where the "producer process" would be clusters of multivariate signals from an archived Data Historian database, or from an application program interface ("API"), to a set of sensors.

In contrast, in embodiments, the key elements of the MSET2 algorithmic structure are integrated with the advanced sensor high-frequency waveform digital-signal-processing algorithm embedded in sensor 112. Embodiments transform in real-time or near real-time the raw sensor waveform into multiple distinct frequency bands, and digitizes the separate bands at a lower output sampling rate (e.g., 1-2 KHz) for each independent band (10 bands in one embodiment). This in effect turns the sensor firmware into a 10-time-series prognostic algorithm that is monitoring the correlation patterns among the 10 time-series bands, using a "pre-trained" model, trained off-line with known good conductors and stored in firmware, for "near-real-time" condition inferencing with extremely low latencies.

The integrated hardware/firmware/advanced-pattern-recognition system in embodiments detects the "leading edge" of degradation in signal quality with ultra-low false-alarm and missed-alarm probabilities, crucial for safety-critical event detection. Embodiments include sufficiently low response latencies to actuate a control signal to the adjacent feeder switch to de-energize the conductor before it hits the ground (if completely severed), or before the damaged conductor falls to ground or the tree branch in the line causes a wildfire. Similarly, as the sensors provide very high sample rates of line voltage and current, the MSET2 or other pattern recognizer can detect under frequency and voltage violations, and then autonomously respond with appropriate controls to nearby inverter-based DER controllers to mitigate the disturbance.

The integrated hardware/software sensor, in embodiments, creates a new functionality in the NMS to provide the situational awareness and overarching authority to the distributed processes to enable to the utility operator to set automatic response operations, as well as allow the utility operator lock-out/tag-out the automated response for crew and public safety when working on the line.

In embodiments, Oracle Digital Asset Cloud Service ("DACS") is used to manage the device digital twin model, device attributes, settings, firmware, communications, and embedded applications, including MSET2. In embodiments, Oracle Enterprise Communications Platform ("ECP") is used to manage secure telecommunications to and from high speed sensor 112, including controls, firmware and embedded applications. In embodiments, a "Cloud Historian" is used to store sensor measurements for analytics for measurement and verification of the automated responses and continuous improvement of the MSET2 settings for automated responses and failure detection.

As disclosed, embodiments integrate a high speed optical current/voltage sensor with a prognostic machine learning firmware to provide multiple advantages, in contrast to known solutions of solving the utility industry challenges of: (1) falling conductors that every year bring multiple catastrophic events in North America and other geographic regions; and (2) enabling "synthetic" inertia within inverter based DER controllers for grid resiliency.

Advantages include allowing sensor 112 to be integrated with real-time prognostic pattern recognition 114, which allows for relatively easy attachment to legacy overhead-cable assets for utilities, therefore avoiding prohibitive costs if utilities instead had to upgrade the national distribution grid architecture to mitigate falling-conductor catastrophes.

In embodiments, the sensor signal processor provides signals to and hosts the MSET2 signal detection with "If This Then That" ("IFTTT") Active Network Management ("ANM") response schemes running on grid edge sensors, meters, and other devices. The actual grid edge device apps would be set by an NMS operations engineer to configure the distributed ANM scheme with MSET2 detection and IFTTT response to upload into DACS to deploy into the field device for very high speed autonomous distributed disturbance mitigation before it becomes a catastrophic system event such as a wildfire or power system collapse.

Further, the use of an advanced pattern recognition algorithmic architecture, such as MSET2, provides advantages from being a deterministic mathematical algorithm that parallelizes on low-cost multi-thread CPUs and GPUs, unlike competitive ML algorithms that are based upon Neural Networks and Support Vector Machines. For example, MSET2 gets orders-of-magnitude speedup acceleration for high-sampling-rate digitized signals compared with NNs and SVMs.

Further, MSET2 breaks the "sea saw" tradeoff between False-Alarm and Missed-Alarm Probabilities (FAPs/MAPs) that is endemic to other ML approaches where if the application requires higher sensitivity to catch anomalies earlier, the FAPs go up, but "raising the thresholds" to avoid elevated FAPs causes the MAPs to go up. In embodiments, MSET2 with an integrated Sequential Probability Ratio Test ("SPRT") allows sensor 112 to independently specify the FAP and the MAP, in contrast to known ML monitoring algorithms where if the application calls for lowering one, it results in raising the other.

Further, MSET2 provides for "explainability" for highly-precise traceback root-cause-analysis, which is an essential feature for safety-critical and life-critical utility applications. MSET2, because it is a deterministic mathematical algorithm, is reversible. This means that rigorous reliability analyses can be performed where it is essential to perform "propagation of uncertainty" analyses to prove that some combination of noise components on the input signal waveforms cannot mask or otherwise invalidate prognostic decisions by the ML algorithm for "Degradation vs. No Degradation" with each buffer of measurements, as well as the ability to audit decisions coming out of the ML by doing "traceback RCA" to prove to regulators and insurance asset-risk specialists what characteristics in input signals caused Degradation Alarms, or the absence of Degradation Alarms. Known Neural Networks and SVMs, because of the stochastic optimization of the weights, are not amenable to rigorous "propagation of uncertainty" analysis in the forward direction, nor traceback RCA in the reverse direction.

The features, structures, or characteristics of the disclosure described throughout this specification may be combined in any suitable manner in one or more embodiments. For example, the usage of "one embodiment," "some embodiments," "certain embodiment," "certain embodiments," or other similar language, throughout this specification refers to the fact that a particular feature, structure, or characteristic described in connection with the embodiment may be included in at least one embodiment of the present disclosure. Thus, appearances of the phrases "one embodiment," "some embodiments," "a certain embodiment," "certain embodiments," or other similar language, throughout this specification do not necessarily all refer to the same group of embodiments, and the described features, structures, or characteristics may be combined in any suitable manner in one or more embodiments.

One having ordinary skill in the art will readily understand that the embodiments as discussed above may be practiced with steps in a different order, and/or with elements in configurations that are different than those which are disclosed. Therefore, although this disclosure considers the outlined embodiments, it would be apparent to those of skill in the art that certain modifications, variations, and alternative constructions would be apparent, while remaining within the spirit and scope of this disclosure. In order to determine the metes and bounds of the disclosure, therefore, reference should be made to the appended claims.

What is claimed is:

1. A method of detecting one or more events on an electrical grid, the method comprising:

using a sensor installed at an edge of the electrical grid, generating a sensor waveform at a first sampling rate corresponding to current and/or voltage signals;

transforming the sensor waveform into multiple distinct independent frequency bands;

digitizing each of the multiple distinct independent frequency bands at a second sampling rate that is lower than the first sampling rate to generate a plurality of different time-series bands corresponding to each distinct independent frequency band;

receiving, by a pattern recognition machine learning (ML) algorithm at the edge, the plurality of different time-series bands corresponding to each distinct independent frequency band in real time or near real time as the time-series bands are produced; and predicting, using the ML algorithm, an occurrence of the one or more events in response to receiving the plurality of different time-series bands, the predicting comprising anomaly detection.

2. The method of claim 1, wherein the sensor is an optical accelerometer sensor having a sampling rate of approximately 60 KHz or greater.

3. The method of claim 1, wherein the ML algorithm comprises a nonlinear nonparametric regression algorithm.

4. The method of claim 1, further comprising:

sending a notification of the one or more events to a line controller which is adapted, in response to the notification, to provide mitigation control.

5. The method claim 1, wherein the pattern recognition machine learning (ML) algorithm is in remote communication with a Digital Asset Cloud Service (DACS) and a Network Management System (NMS).

6. The method of claim 1, wherein the multiple distinct independent frequency bands have a corresponding matrix comprising a plurality of columns, further comprising determining an average magnitude of the columns.

7. The method of claim 6, further comprising generating the time-series bands from the columns and inputting the time-series bands to the ML algorithm.

8. The method of claim 5, wherein the DACS is remotely located in a cloud infrastructure, and the NMS is located on-premise at a utility that is managing the electrical grid.

9. The method of claim 1, wherein the one or more events comprises a tree branch contacting a conductor on the electrical grid.

10. An electrical grid event detection system comprising:

a sensor installed at an edge of the electrical grid, the sensor adapted to generate a sensor waveform at a first sampling rate corresponding to current and/or voltage signals; and one or more processors executing instructions and configured to:

transform the sensor waveform into multiple distinct independent frequency bands;

digitize each of the multiple distinct independent frequency bands at a second sampling rate that is lower than the first sampling rate to generate a plurality of different time-series bands corresponding to each distinct independent frequency band;

receive, by a pattern recognition machine learning (ML) algorithm at the edge, the plurality of different time-series bands corresponding to each distinct independent frequency band in real time or near real time as the time-series bands are produced; and predict, using the ML algorithm, an occurrence of the one or more events in response to receiving the plurality of different time-series bands, the predicting comprising anomaly detection.

11. The system of claim 10, wherein the sensor comprises an optical accelerometer sensor having a sampling rate of approximately 60 KHz or greater.

12. The system of claim 10, wherein the ML algorithm comprises a nonlinear nonparametric regression algorithm.

13. The system of claim 10, the processors further configured to:

send a notification of the one or more events to a line controller which is adapted, in response to the notification, to provide mitigation control.

14. The system claim 10, further comprising:

a Digital Asset Cloud Service (DACS) in remote communication with the ML algorithm; and a Network Management System (NMS) in remote communication with the ML algorithm.

15. The system of claim 10, wherein the multiple distinct independent frequency bands have a corresponding matrix comprising a plurality of columns, further comprising determining an average magnitude of the columns.

16. The system of claim 15, the processors further configured to generate the time-series bands from the columns and inputting the time-series bands to the ML algorithm.

17. The system of claim 14, wherein the DACS is remotely located in a cloud infrastructure, and the NMS is located on-premise at a utility that is managing the electrical grid.

18. The system of claim 10, wherein the one or more events comprises a tree branch contacting a conductor on the electrical grid.

19. A non-transitory computer readable medium having instructions stored thereon that, when executed by one or more processors, cause the processors to detect one or more events on an electrical grid, the detecting comprising:

using a sensor installed at an edge of the electrical grid, generating a sensor waveform at a first sampling rate corresponding to current and/or voltage signals;

transforming the sensor waveform into multiple distinct independent frequency bands;

digitizing each of the multiple distinct independent frequency bands at a second sampling rate that is lower than the first sampling rate to generate a plurality of different time-series bands corresponding to each distinct independent frequency band;

receiving, by a pattern recognition machine learning (ML) algorithm at the edge, the plurality of different time-series bands corresponding to each distinct independent frequency band in real time or near real time as the time-series bands are produced; and predicting, using the ML algorithm, an occurrence of the one or more events in response to receiving the plurality of different time-series bands, the predicting comprising anomaly detection.

20. The computer readable medium of claim 19, the detecting further comprising:

sending a notification of the one or more events to a line controller which is adapted, in response to the notification, to provide mitigation control.

* * * * *